(12) United States Patent
Katsunaga et al.

(10) Patent No.: US 9,287,719 B2
(45) Date of Patent: Mar. 15, 2016

(54) POWER SUPPLY SIDE EQUIPMENT AND RESONANCE-TYPE NON-CONTACT POWER SUPPLY SYSTEM

(75) Inventors: Hiroshi Katsunaga, Kariya (JP); Yukihiro Yamamoto, Kariya (JP); Koji Nakamura, Kariya (JP); Shinji Ichikawa, Toyota (JP); Toru Nakamura, Toyota (JP)

(73) Assignee: Kabushiki Kaisha Toyota Jidoshokki and Toyota Jidosha Kabushiki Kaisha (JP)

( * ) Notice: Subject to any disclaimer, the term of this patent is extended or adjusted under 35 U.S.C. 154(b) by 198 days.

(21) Appl. No.: 14/233,042

(22) PCT Filed: Jul. 20, 2012

(86) PCT No.: PCT/JP2012/068444
§ 371 (c)(1),
(2), (4) Date: Apr. 17, 2014

(87) PCT Pub. No.: WO2013/012061
PCT Pub. Date: Jan. 24, 2013

(65) Prior Publication Data
US 2015/0061579 A1 Mar. 5, 2015

(30) Foreign Application Priority Data

Jul. 20, 2011 (JP) ................. 2011-159069

(51) Int. Cl.
*H02J 7/00* (2006.01)
*H02J 5/00* (2006.01)
(Continued)

(52) U.S. Cl.
CPC ............... *H02J 5/005* (2013.01); *B60L 11/182* (2013.01); *H02J 7/025* (2013.01); *H03F 3/2176* (2013.01); *H03H 7/40* (2013.01); *Y02T 10/7005* (2013.01); *Y02T 90/122* (2013.01); *Y02T 90/14* (2013.01)

(58) Field of Classification Search
CPC ........... H02J 5/005; H02J 7/025; H02J 17/00; H02J 7/045; H02J 7/35; H02J 2007/0062; H02J 3/32; H02J 3/383; H02J 5/00; H02J 7/0004; H02J 7/0027; H02J 7/0029; H02J 7/0047; H02J 7/0055; B60L 11/182
USPC .................................................. 320/106–115
See application file for complete search history.

(56) References Cited

U.S. PATENT DOCUMENTS 6,232,841 B1    5/2001  Bartlett et al.
(Continued)

FOREIGN PATENT DOCUMENTS

JP      2009-106136        5/2009
WO      WO 01/03288 A1     1/2001
WO      WO 2009/054221 A1  4/2009

OTHER PUBLICATIONS

International Patent Application No. PCT/JP2012/068444: International Preliminary Report on Patentability dated Jan. 21, 2014, 5 pages.

*Primary Examiner* — Binh Tat
(74) *Attorney, Agent, or Firm* — Baker & Hostetler LLP

(57) ABSTRACT

Power supply side equipment comprises a high-frequency power supply, a matching box, a primary side resonance coil, an output impedance variable unit, a matching state detection unit, and a control unit. By a magnetic field resonance, the primary side resonance coil transmits power in a non-contact manner to a load through a secondary side resonance coil. At least the matching box, the primary side resonance coil, the secondary side resonance coil, and the load constitute a resonance system having a resonant frequency. The matching state detection unit detects the matching state between the input impedance of the resonance system and the output impedance of the high-frequency power supply at the resonant frequency. The control unit adjusts the output impedance variable unit and the matching box according to the detection result by the matching state detection unit so that the input impedance of the resonance system and the output impedance of the high-frequency power supply match each other.

10 Claims, 3 Drawing Sheets

(51) Int. Cl.
*H03H 7/40* (2006.01)
*H03F 3/217* (2006.01)
*H02J 7/02* (2006.01)
*B60L 11/18* (2006.01)

(56) References Cited

U.S. PATENT DOCUMENTS

2002/0062141 A1  5/2002  Moore
2009/0021256 A1*  1/2009  Soutome .......... G01R 33/34007
                                                    324/318
2010/0225271 A1  9/2010  Oyobe et al.
2011/0121778 A1  5/2011  Oyobe et al.
2011/0304216 A1*  12/2011  Baarman ................. H02J 17/00
                                                    307/104
2012/0025761 A1*  2/2012  Takada .................... H02J 5/005
                                                    320/108
2012/0161538 A1  6/2012  Kinoshita et al.

* cited by examiner ly fixed at 50Ω. Thus, in the resonance type contactless power supplying system that is formed by the high frequency power supply, the matching device, the primary coil, the secondary coil, and the load, when the input impedance of the resonance system changes, the input impedance of the resonance system needs to be matched with the output impedance of the high frequency power supply by adjusting the matching device. However, there are many parameters that change the input impedance in the resonance system, and the input impedance is changed in large ranges. Thus, the matching device is difficult to design. Further, it is difficult to expand the matching range when coping with changes in the input impedance of the resonance system by adjusting the matching device, which is arranged between the high frequency power supply and the primary coil.

POWER SUPPLY SIDE EQUIPMENT AND RESONANCE-TYPE NON-CONTACT POWER SUPPLY SYSTEM

CROSS-REFERENCE TO RELATED APPLICATIONS

This application is the National Stage of International Application No. PCT/JP2012/068444 filed Jul. 12, 2012, which claims the benefit of Japanese Application No. 2011-159069, filed Jul. 20, 2011, the disclosures of which are incorporated herein by reference in their entireties.

TECHNICAL FIELD

The present invention relates to power supplying equipment and a resonance type contactless power supplying system.

BACKGROUND ART

A vehicle power supplying device that implements resonance to supply charging power through wireless connection from a power supply located outside a vehicle has been proposed in the prior art (refer to patent document 1). The charging system of patent document 1 includes a motor-driven vehicle and a power supplying device. The motor-driven vehicle includes a secondary self-resonance coil (secondary resonance coil), a secondary coil, a rectifier, and an electric storage device. The power supplying device includes a high frequency power supply, a primary coil, and a primary self-resonance coil (primary resonance coil). The distance between the power supplying device and the vehicle changes in accordance with the status of the vehicle (load status, tire pressure, etc.). A change in the distance between the primary self-resonance coil of the power supplying device and the secondary self-resonance coil of the vehicle leads changes in the resonant frequency of the primary self-resonance coil and the secondary self-resonance coil. Patent document 1 thus discloses an adjustment device allowing for adjustment of the resonant frequency of the primary self-resonance coil by changing at least either one of the capacitance or inductance of the primary self-resonance coil. Specifically, the primary self-resonance coil includes a variable capacitor connected between conductive wires. The variable capacitor has a variable capacitance varied by a control signal from a vehicle ECU. By varying the capacitance of the capacitor, the capacitance of the primary self-resonance coil may be varied.

The arrangement of a matching device between the high frequency power supply and the primary coil has also been proposed. When the input impedance of a resonance system changes due to load fluctuation, changes in the distance between the resonance coils, displacement of the resonance coils, and the like, adjustments are performed with the matching device to adjust and match an input impedance of a resonance system and an output impedance of the high frequency power supply. The input impedance of the resonance system is determined by the matching device, the primary coil, the primary resonance coil, the secondary resonance coil, the secondary coil, and the load.

PRIOR ART DOCUMENT

Patent Document

Patent Document 1: Japanese Laid-Open Patent Publication No. 2009-106136

SUMMARY OF THE INVENTION

The output impedance of the high frequency power supply is generally fixed at 50Ω. Thus, in the resonance type contactless power supplying system that is formed by the high frequency power supply, the matching device, the primary coil, the secondary coil, and the load, when the input impedance of the resonance system changes, the input impedance of the resonance system needs to be matched with the output impedance of the high frequency power supply by adjusting the matching device. However, there are many parameters that change the input impedance in the resonance system, and the input impedance is changed in large ranges. Thus, the matching device is difficult to design. Further, it is difficult to expand the matching range when coping with changes in the input impedance of the resonance system by adjusting the matching device, which is arranged between the high frequency power supply and the primary coil.

It is an object of the present invention to provide power supplying equipment and a resonance type contactless power supplying system capable of relaxing the design requirements of the matching device and enlarging the matching range.

To achieve the above object, one aspect of the present invention is power supplying equipment including a high frequency power supply, a matching device, a primary resonance coil, an output impedance varying unit, a matching status detection unit, and a control unit. The matching device is connected to an output portion of the high frequency power supply. The primary resonance coil is supplied with power from the high frequency power supply via the matching device. The primary resonance coil transmits power in a contactless manner to a load via a secondary resonance coil through magnetic field resonance. At least the matching device, the primary resonance coil, the secondary resonance coil, and the load form a resonance system have a resonant frequency. The output impedance varying unit is arranged in the high frequency power supply. The matching status detection unit detects a matching status between an input impedance of the resonance system at the resonant frequency and an output impedance of the high frequency power supply. The control unit performs adjustment on the output impedance varying unit and the matching device based on a detection result of the matching status detection unit so that the input impedance of the resonance system is matched with the output impedance of the high frequency power supply.

When using power supplying equipment of the present invention in a resonance type contactless power supplying system, the primary resonance coil of the power supplying equipment receives power from the high frequency power supply, and transmits power in a contactless manner to the load via the secondary resonance coil through magnetic field resonance. The matching status between the input impedance of the resonance system at the resonant frequency of the resonance system and the output impedance of the high frequency power supply is detected by the matching status detection unit. When detected that the input impedance of the resonance system at the resonant frequency of the resonance system and the output impedance of the high frequency power supply are not matched, the output impedance varying unit is adjusted by the control unit to perform a rough adjustment so that the output impedance of the high frequency power supply approaches the input impedance of the resonance system. The matching device is then adjusted by the control unit to perform a fine adjustment of the input impedance of the resonance system so that the input impedance of the resonance system is matched with the output impedance of the high frequency power supply. The matching range is difficult to expand when matching the output impedance of the high frequency power supply and the input impedance of the resonance system with only the matching device. However, the matching range may be expanded when the output impedance varying unit and the matching device are both used to perform the adjustment. Therefore, the design requirements of the matching device may be relaxed, and the matching range may be enlarged.

A further aspect of the present invention is a resonance type contactless power supplying system including power supplying equipment, mobile body equipment, an output impedance varying unit, a matching status detection unit, and a control unit. The power supplying equipment includes a high frequency power supply, a matching device connected to an output portion of the high frequency power supply, and a primary resonance coil supplied with power from the high frequency power supply via the matching device. The mobile body equipment includes a secondary resonance coil, which receives power from the primary resonance coil through magnetic field resonance, and a load, which is supplied with power received by the secondary resonance coil. At least the matching device, the primary resonance coil, the secondary resonance coil, and the load form a resonance system having a resonant frequency. The output impedance varying unit is arranged in the high frequency power supply. The matching status detection unit detects a matching status between an input impedance of the resonance system at the resonant frequency and an output impedance of the high frequency power supply. The control unit performs adjustment on the output impedance varying unit and the matching device based on a detection result of the matching status detection unit so that the input impedance of the resonance system is matched with the output impedance of the high frequency power supply.

In this invention, the power supplied in a contactless manner from the primary resonance coil of the power supplying equipment is received by the secondary resonance coil of the mobile body equipment, and the power received by the secondary resonance coil is supplied to the load. The matching status between the input impedance of the resonance system at the resonant frequency of the resonance system and the output impedance of the high frequency power supply is detected by the matching status detection unit. When detected that the input impedance of the resonance system and the output impedance of the high frequency power supply do not match, the output impedance varying unit is adjusted by the control unit to perform a rough adjustment so that the output impedance of the high frequency power supply approaches the input impedance of the resonance system. The matching device is then adjusted by the control unit to perform a fine adjustment of the input impedance of the resonance system so that the input impedance of the resonance system is matched with the output impedance of the high frequency power supply. The matching range is difficult to expand when matching of the output impedance of the high frequency power supply and the input impedance of the resonance system with only the matching device. However, the matching range may be expanded when the output impedance varying unit and the matching device are both used to perform the adjustment. Therefore, the design requirements of the matching device may be relaxed, and the matching range may be enlarged.

Preferably, the high frequency power supply includes a class E amplification circuit, and the class E amplification circuit includes the output impedance varying unit.

At least one of the capacitor and the inductor that forms the class E amplification circuit is configured to be adjustable by a command from the control unit so that the output impedance varying unit is configured. Therefore, an increase in the number of components may be suppressed and the accommodation space of components may be reduced compared to when adding a new output impedance varying unit.

DETAILED DESCRIPTION OF THE PREFERRED EMBODIMENTS

One embodiment of a resonance type contactless charging system for charging an in-vehicle battery according to the present embodiment will now be described with reference to FIGS. 1 and 2.

Figure 1:
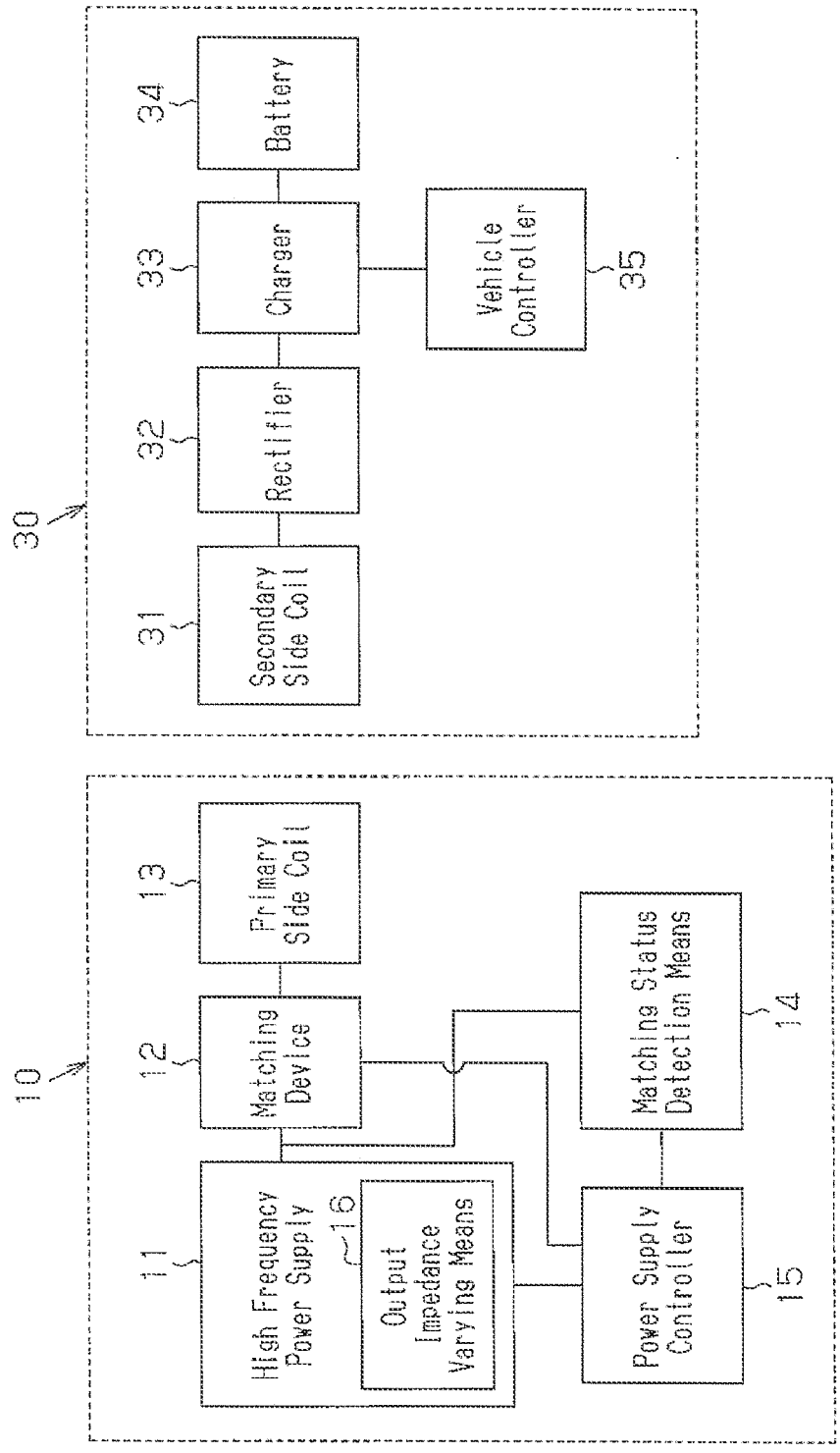
FIG. 1 is a diagram showing the configuration of a resonance type contactless charging system according to one embodiment of the present invention.

As shown in FIG. 1, a resonance type contactless charging system serving as a resonance type contactless power supplying system includes power supplying equipment 10 (power transmission equipment), which is arranged on the ground side, and mobile body equipment 30 (power reception equipment), which is installed in a vehicle serving as a mobile body.

The power supplying equipment 10 includes a high frequency power supply 11, a matching device 12 connected to an output portion of the high frequency power supply 11, a primary side coil 13, a matching status detection unit 14, and a power supply controller 15 serving as a control unit. The high frequency power supply 11 includes an output impedance varying unit 16.

The mobile body equipment 30 includes a secondary side coil 31, a rectifier 32, a charger 33, a battery 34 (secondary battery) connected to the charger 33, and a vehicle controller 35. The rectifier 32, the charger 33, and the battery 34 form a load.

The matching device 12, the primary side coil 13, the secondary side coil 31, and the load (rectifier 32, charger 33, and battery 34) form a resonance system. The matching status detection unit 14 detects the matching status between the input impedance of the resonance system at a resonant frequency of the resonance system and the output impedance of the high frequency power supply 11.

The vehicle controller 35 receives a detection signal from a detection unit (SOC detection unit), which is not shown in the drawings and which detects the state of charge (SOC) of the battery 34. This allows for the state of charge of the battery 34 to be checked. The power supply controller 15 and the vehicle controller 35 can communicate through a wireless communication device (not shown), and the power supply controller 15 acquires information on the state of charge from the vehicle controller 35. The power supply controller 15 includes a memory that stores data indicating the relationship of the state of charge (SOC) of the battery 34 and the suitable input impedance of the resonance system at the resonant frequency of the resonance system when the distance between the primary resonance coil 13b and the secondary resonance coil 31b is as set in advance.

Figure 2:
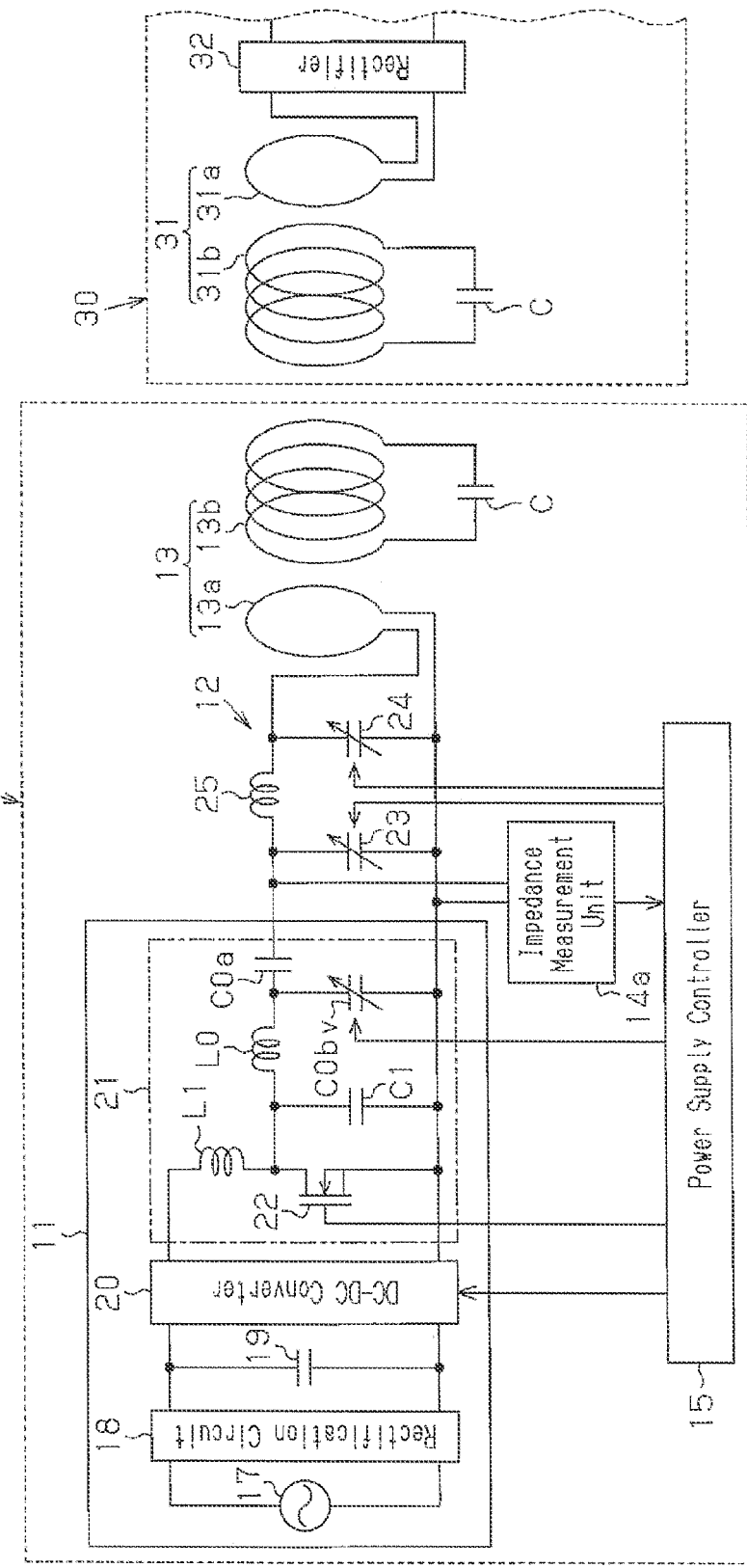
FIG. 2 is a circuit diagram showing in part the resonance type contactless charging system of FIG. 1.

As shown in FIG. 2, the primary side coil 13 includes a primary coil 13a and a primary resonance coil 13b. The primary coil 13a is connected to the high frequency power supply 11 through the matching device 12. The primary coil 13a and the primary resonance coil 13b are coaxially arranged, and a capacitor C is connected in parallel to the primary resonance coil 13b. The primary coil 13a is coupled by electromagnetic induction to the primary resonance coil 13b, and the AC power supplied from the high frequency power supply 11 to the primary coil 13a is supplied to the primary resonance coil 13b through electromagnetic induction.

The secondary side coil 31 includes a secondary coil 31a and a secondary resonance coil 31b. The secondary coil 31a and the secondary resonance coil 31b are coaxially arranged, and a capacitor C is connected to the secondary resonance coil 31b. The secondary coil 31a is coupled by electromagnetic induction to the secondary resonance coil 31b, and the AC power supplied from the primary resonance coil 13b to the secondary resonance coil 31b through resonance is supplied to the secondary coil 31a through electromagnetic induction. The secondary coil 31a is connected to the rectifier 32. In the present embodiment, the primary coil 13a, the primary resonance coil 13b, the secondary resonance coil 31b, and the secondary coil 31a have the same winding diameter. The primary resonance coil 13b and the secondary resonance coil 31b have the same structure, and capacitors having the same structure are used as the capacitors C. The charger 33, the battery 34, and the vehicle controller 35 are not illustrated in FIG. 2.

The output impedance varying unit 15 is configured using a class E amplification circuit that includes the high frequency power supply 11. In detail, as shown in FIG. 2, the high frequency power supply 11 includes an AC commercial power supply 17, a rectification circuit 18, a filter 19, a DC-DC converter 20, and a class E amplification circuit 21. The class E amplification circuit 21 includes a MOSFET that serves as a switching element 22. A positive output terminal of the DC-DC converter 20 is connected to the drain of the MOSFET via an inductor L1. The source of the MOSFET is connected to a negative terminal of the DC-DC converter 20. The gate of the MOSFET is connected to the power supply controller 15. A capacitor C1 is connected in parallel to the switching element 22. A series circuit that includes an inductor L0 and a capacitor C0a is connected between the output terminal of the class E amplification circuit 21 and a joining point of the inductor L1 and the drain of the MOSFET. A variable capacitor C0bv is connected to a joining point of the inductor L0 and the capacitor C0a. A change in the capacitance of the variable capacitor C0bv changes the impedance of the variable capacitor C0bv, and, consequently, changes the output impedance of the high frequency power supply 11. In this embodiment, the variable capacitor C0bv forms the output impedance varying unit 16. An impedance measurement unit 14a is connected to an output line of the high frequency power supply 11, and a detection signal of the impedance measurement unit 14a is input to the power supply controller 15. The power supply controller 15 determines whether or not the input impedance of the resonance system at the resonant frequency of the resonance system is matched with the output impedance of the high frequency power supply 11 based on the detection signal of the impedance measurement unit 14a. The impedance measurement unit 14a and the power supply controller 15 function as the matching status detection unit 14.

As shown in FIG. 2, the matching device 12 includes two variable capacitors 23 and 24 and an inductor 25. One variable capacitor 23 is connected to the high frequency power supply 11, and the other variable capacitor 24 is connected in parallel to the primary coil 13a. The inductor 25 is connected between the variable capacitors 23 and 24. The capacitances of the variable capacitors 23 and 24 are changed to change the impedance of the matching device 12.

The operation of the resonance type contactless charging system will now be described.

When charging the battery 34 installed in the vehicle, the battery 34 is charged in a state in which the vehicle is stopped at a predetermined position close to the power supplying equipment 10. The vehicle controller 35 transmits a charging request signal to the power supply controller 15. The vehicle controller 35 checks the state of charge (SOC) of the battery 34 and transmits the information of the state of charge to the power supply controller 15. The power supply controller 15 checks the charging request signal. Based on the information on the state of charge of the battery 34, the power supply controller 15 controls the switching element 22 so that the high frequency power supply 11 outputs AC power at a frequency equal to the resonant frequency of the resonance system in correspondence with the state of charge. Under this situation, the power supply controller 15 performs a matching operation on the input impedance of the resonance system and the output impedance of the high frequency power supply 11. The power supply controller 15 also outputs high frequency power from the high frequency power supply 11 to the primary coil 13a at the resonant frequency of the resonance system.

The high frequency power is output from the high frequency power supply 11 to the primary coil 13a at the resonant frequency of the resonance system, and a magnetic field is generated at the primary resonance coil 13b, to which is supplied with power through electromagnetic induction. The magnetic field is strengthened by the magnetic field resonance of the primary resonance coil 13b and the secondary resonance coil 31b. The secondary coil 31a retrieves the AC power from the strengthened magnetic field proximal to the secondary resonance coil 31b through electromagnetic induction. The AC power is rectified by the rectifier 32 and then used by the charger 33 to charge the battery 34.

The power supply controller 15 receives the detection signal of the matching status detection unit 14. The power supply controller 15 outputs a command signal to the output impedance varying unit 16 and the matching device 12 so that the input impedance of the resonance system is matched with the output impedance of the high frequency power supply 11 based on the detection signal. In detail, the power supply controller 15 first outputs an adjustment command to the output impedance varying unit 16 to perform a rough adjustment for matching the output impedance of the high frequency power supply 11 with the input impedance of the resonance system, and then outputs an adjustment command to the matching device 12 to perform a fine adjustment for matching the output impedance of the high frequency power supply 11 with the input impedance of the resonance system.

When charging the battery 34, changes in the state of charge of the battery 34 changes the input impedance of the resonance system at the resonant frequency of the resonance system. This deviates the matching between the output impedance of the high frequency power supply 11 and the input impedance of the resonance system from the optimum state, and power cannot be efficiently supplied (power-supplied) from the power supplying equipment 10 to the mobile body equipment 30. To efficiently supply power from the power supplying equipment 10 to the mobile body equipment 30 even when the state of charge of the battery 34 changes during charging, the vehicle controller 35 transmits the information on the state of charge of the battery 34 to the power supply controller 15 during the charging. The power supply controller 15 then adjusts the output impedance varying unit 16 and the matching device 12 to suitable values in correspondence with the state of charge of the battery 34 to match the input impedance of the resonance system with the output impedance of the high frequency power supply 11.

When the battery 34 is fully charged, the vehicle controller 35 stops the charging performed by the charger 33, and transmits a charging end signal to the power supply controller 15. When, for example, a driver inputs a charging stop command, even if the fully charged state has not yet been reached, the vehicle controller 35 stops the charging performed by the charger 33 and transmits the charge end signal to the power supply controller 15. The power supply controller 15 ends the power transmission (power supply) when receiving the charging end signal.

This embodiment has the advantages described below.

(1) The resonance type contactless charging system includes the power supplying equipment 10 and the mobile body equipment 30. The power supplying equipment 10 includes the high frequency power supply 11 provided with the output impedance varying unit 16, the matching device 12 connected to the output portion of the high frequency power supply 11, and the primary resonance coil 13b supplied with power from the high frequency power supply 11 via the matching device 12. The mobile body equipment 30 includes the secondary resonance coil 31b that receives power from the primary resonance coil 13b through magnetic field resonance, and the load (rectifier 32, charger 33, and battery 34) supplied with the power received by the secondary resonance coil 31b. The matching device 12, the primary coil 13a, the primary resonance coil 13b, the secondary resonance coil 31b, the secondary coil 31a, and the load configure the resonance system. The resonance type contactless charging system includes the matching status detection unit 14, which detects the matching status between the input impedance of the resonance system at the resonant frequency of the resonance system and the output impedance of the high frequency power supply 11, and the power supply controller 15, which adjusts the output impedance varying unit 16 and the matching device 12 to match the input impedance of the resonance system with the output impedance of the high frequency power supply 11 based on the detection result of the matching status detection unit 14. Accordingly, compared to a configuration that uses only the matching device 12 to match the input impedance of the resonance system with the output impedance of the high frequency power supply 11, the design requirements of the matching device 12 is relaxed (relaxation of matching adjustment range, relaxation of selection requirement for configuring element of matching device), and the matching range is enlarged.

(2) After the output impedance varying unit 16 is adjusted to perform rough adjustment so that the output impedance of the high frequency power supply 11 approaches the input impedance of the resonance system, the matching device 12 is adjusted to perform fine adjustment of the input impedance of the resonance system so that the input impedance of the resonance system is matched with the output impedance of the high frequency power supply 11. Therefore, the matching operation of the input impedance of the resonance system and the output impedance of the high frequency power supply 11 is facilitated compared to when first adjusting the matching device 12.

(3) The output impedance varying unit 16 configures a portion of the class E amplification circuit 21 incorporated in the high frequency power supply 11. In other words, the class E amplification circuit 21 includes the output impedance varying unit 16. Accordingly, compared to when newly adding the output impedance varying unit 16, an increase in the number of components may be suppressed, and there is no need to enlarge accommodation space for components.

(4) The power supply controller 15 and the vehicle controller 35 are communicable with each other via the wireless communication device. The power supply controller 15 acquires information on the state of charge from the vehicle controller 35 to perform a matching operation on the input impedance of the resonance system and the output impedance of the high frequency power supply 11 in correspondence with the state of charge. Accordingly, the adjustment is performed within a shorter time compared to when performing the adjustment of the output impedance varying unit 15 and the matching device 12 without the information on the state of charge.

The embodiment is not limited to the foregoing description and may be applied, for example, as described below.

Figure 3A:
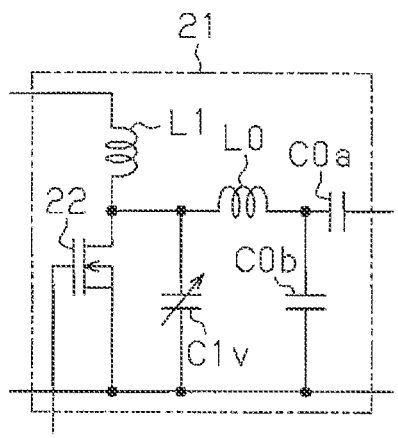
FIGS. 3A and 3B are circuit diagrams showing a class E amplification circuit in a further embodiment.
Figure 3B:
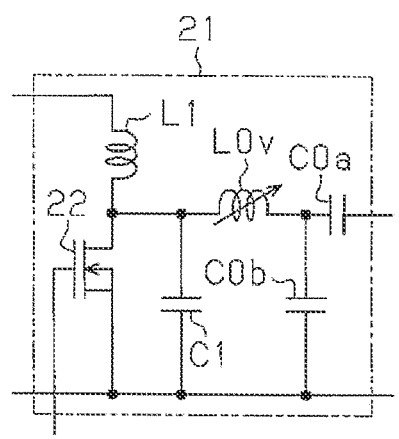

When the output impedance varying unit 16 forms a portion of the class E amplification circuit 21, for example, as shown in FIG. 3A, a capacitor $C0b$ may be used in place of the variable capacitor $C0bv$, and a variable capacitor $C1v$ may be used in place of the capacitor $C1$. Alternatively, as shown in FIG. 3B, a variable inductor $L0v$ may be used in place of the inductor $L0$. The variable capacitors $C1v$ and $C0bv$ and the variable inductor $L0v$ may all be used or either one of the variable capacitors $C1v$ and $C0bv$ and the variable inductor $L0v$ may be used.

Figure 4A:
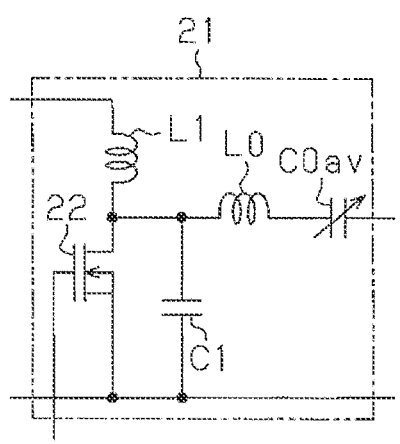
FIGS. 4A and 4B are circuit diagrams showing a class E amplification circuit in a further embodiment.
Figure 4B:
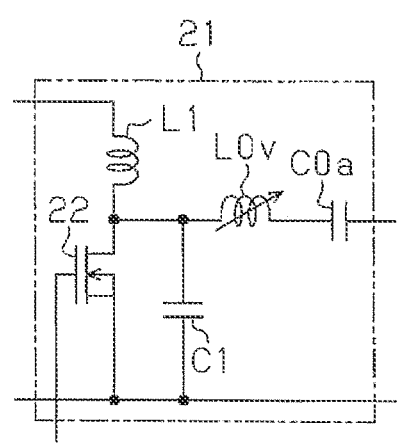

As shown in FIG. 4A, the capacitor $C0b$ may be omitted and a variable capacitor $C0av$ may be used in place of the capacitor $C0a$ as the configuration of the class E amplification circuit 21. Alternatively, as shown in FIG. 4B, the capacitor $C0b$ may be omitted, and a variable inductor $L0v$ may be used in place of the inductor $L0$. Further, the variable inductor $L0v$ and the variable capacitor $C0av$ may both be used.

A VSWR measurement device (voltage standing wave ratio measurement device) may be used in place of the impedance measurement unit 14a. In this case, the power supply controller 15 determines the matching status between the input impedance of the resonance system and the output impedance of the high frequency power supply 11 based on the detection signal of the VSWR measurement device. The power supply controller 15 performs adjustment of the output impedance varying unit 16 and the matching device 12 based on the detection signal of the VSWR measurement device so that the voltage standing wave ratio becomes smaller than or equal to a value set in advance. In this case, the VSWR measurement device and the power supply controller 15 configure the matching status detection unit.

The high frequency power supply 11 may include a reflection power detection unit that detects reflection power from the primary resonance coil 13b. In this case, the power supply controller 15 determines the matching status between the input impedance of the resonance system and the output impedance of the high frequency power supply 11 based on the detection signal of the reflection power detection unit. The power supply controller 15 performs the adjustment of the output impedance varying unit 16 and the matching device 12 so that the reflection power becomes smaller than or equal to a value set in advance based on the detection signal of the reflection power detection unit. In this case, the reflection power detection unit serves as the matching status detection unit. Further, in this case, the power supply controller 15 may adjust the output impedance varying unit 16 and the matching device 12 to an appropriate state based on the detection signal of the reflection power detection unit without acquiring the information on the state of charge of the battery 34 from the vehicle controller 35.

The primary coil 13a, the primary resonance coil 13b, the secondary coil 31a, and the secondary resonance coil 31b are not all necessarily required for the resonance type contactless power supplying system to supply power in a contact less manner between the power supplying equipment 10 and the mobile body equipment 30. The resonance type contactless power supplying system merely needs to include at least the primary resonance coil 13b and the secondary resonance coil 31b. In other words, the primary resonance coil 13b may be connected to the high frequency power supply 11 via the matching device 12 instead of forming the primary side coil 13 with the primary coil 13a and the primary resonance coil 13b. Further, the secondary resonance coil 31b may be connected to the rectifier 32 instead of forming the secondary side coil 31 with the secondary coil 31a and the secondary resonance coil 31b. However, a configuration in which the primary coil 13a, the primary resonance coil 13b, the secondary coil 31a, and the secondary resonance coil 31b are all used allows for the primary side coil 13 and the secondary side coil 31 to be more easily adjusted to a resonant state and the resonance state to be more easily maintained even if the distance between the primary resonance coil 13b and the secondary resonance coil 31b increases.

The mobile body equipment 30 may also include a matching device. For example, the matching device may be arranged between the secondary coil 31a and the rectifier 32, and the vehicle controller 35 may perform the adjustment of the matching device. In this case, the vehicle controller 35 first performs the adjustment of the matching device in the mobile body equipment 30 such as when the stop position of the vehicle is slightly displaced from a predetermined position during charging or when the distance between the primary resonance coil 13b and the secondary resonance coil 31b is deviated from a value set in advance due to the weight of the load carried by the vehicle. Then, the power supply controller 15 performs the adjustment of the output impedance varying unit 16 and the matching device 12 to match the input impedance of the resonance system at the resonant frequency of the resonance system with the output impedance of the high frequency power supply 11 more appropriately.

The rectifier 32 may be incorporated in the charger 33.

The matching device 12 is not limited to a configuration including the two variable capacitors 23 and 24 and the inductor 25, and may have, for example, a configuration including a variable inductor serving as the inductor 25 or a configuration including a variable inductor and two non-variable capacitors.

The vehicle serving as the mobile body is not limited to a vehicle that requires a driver and may be an automatic guided vehicle.

The resonance type contactless charging system is not limited to a system for performing contactless charging of the battery 34 that is installed in the vehicle. For example, the resonance type contactless charging system may be a system for performing contactless charging of a battery installed in a mobile body such as a marine vessel and a self-propelled robot or a battery installed in a portable electronic device such as a cellular phone and a portable personal computer.

The resonance type contactless power supplying system is not limited to the resonance type contactless charging system and may be applied to a device installed in a mobile body, such as a robot, to supply power to an electric device in which the load changes in a stepped manner during use.

The high frequency power supply 11 may include an AC power supply other than the AC commercial power supply 17.

The high frequency power supply 11 may include other step-up circuits and step-down circuits instead of the DC-DC converter 20 for the configuration of supplying the DC of a desired voltage to the class E amplification circuit 21.

The high frequency power supply 11 may be configured to output the output frequency at a constant value corresponding to a resonant frequency of the resonance system set in advance. However, the power can be efficiently supplied in correspondence with changes in the load when the frequency may be changed.

The diameters of the primary coil 13a and the secondary coil 31a so not have to be the same as the primary resonance coil 13b and the secondary resonance coil 31b and may be smaller or larger.

The capacitor C connected to the primary resonance coil 13h and the secondary resonance coil 31b may be omitted. However, the resonant frequency may be lowered if the capacitor C is connected compared to when the capacitor C is omitted. Further, if the resonant frequency is the same, the primary resonance coil 13b and the secondary resonance coil 31b may be miniaturized compared to when the capacitor C is omitted.

The invention claimed is:

1. Power supplying equipment comprising:
a high frequency power supply;
an impedance matching device connected to an output portion of the high frequency power supply;
a primary resonance coil supplied with power from the high frequency power supply via the impedance matching device, wherein the primary resonance coil transmits power in a contactless manner to a load via a secondary resonance coil through magnetic field resonance, and at least the impedance matching device, the primary resonance coil, the secondary resonance coil, and the load form a resonance system having a resonant frequency;
an output impedance varying unit arranged in the high frequency power supply;
an impedance matching status detection unit that detects an impedance matching status between an input impedance of the resonance system at the resonant frequency and an output impedance of the high frequency power supply; and
a control unit that performs adjustment on the output impedance varying unit and the impedance matching device based on a detection result of the impedance matching status detection unit so that the input impedance of the resonance system is matched with the output impedance of the high frequency power supply.

2. The power supplying equipment according to claim 1, wherein the high frequency power supply includes a class E amplification circuit, and the class E amplification circuit includes the output impedance varying unit.

3. The power supplying equipment according to claim 1, wherein the control unit controls the output impedance varying unit so that the output impedance varying unit performs a rough adjustment of the impedance matching status, and controls the impedance matching device so that the impedance matching device performs a fine adjustment of the impedance matching status.

4. The power supplying equipment according to claim 1, wherein the impedance matching status detection unit is a reflection power detection unit.

5. A resonance type contactless power supplying system comprising:

power supplying equipment including a high frequency power supply, an impedance matching device connected to an output portion of the high frequency power supply, and a primary resonance coil supplied with power from the high frequency power supply via the impedance matching device;

mobile body equipment including a secondary resonance coil, which receives power from the primary resonance coil through magnetic field resonance, and a load, which is supplied with power received by the secondary resonance coil, wherein at least the impedance matching device, the primary resonance coil, the secondary resonance coil, and the load form a resonance system having a resonant frequency;

an output impedance varying unit arranged in the high frequency power supply;

an impedance matching status detection unit that detects a matching status between an input impedance of the resonance system at the resonant frequency and an output impedance of the high frequency power supply; and a control unit that performs adjustment on the output impedance varying unit and the impedance matching device based on a detection result of the impedance matching status detection unit so that the input impedance of the resonance system is matched with the output impedance of the high frequency power supply.

6. The resonance type contactless power supplying system according to claim 5, wherein the high frequency power supply includes a class E amplification circuit, and the class E amplification circuit includes the output impedance varying unit.

7. The resonance type contactless power supplying system according to claim 5, wherein the control unit controls the output impedance varying unit so that the output impedance varying unit performs a rough adjustment of the impedance matching status, and controls the impedance matching device so that the impedance matching device performs a fine adjustment of the impedance matching status.

8. The resonance type contactless power supplying system according to claim 5, wherein the impedance matching status detection unit is a reflection power detection unit.

9. The resonance type contactless power supplying system according to claim 5, wherein the mobile body equipment is equipped in a vehicle, and the load includes a rectifier, a charger, and a battery.

10. The resonance type contactless power supplying system according to claim 9, wherein the mobile body equipment includes a vehicle controller, the vehicle controller is configured to check the state of charge of the battery, and the control unit is configured to acquire information on the state of charge of the battery from the vehicle controller.

* * * * *